United States Patent [19]

Hartemann

[11] 4,338,575
[45] Jul. 6, 1982

[54] PROCESS FOR COMPENSATING TEMPERATURE VARIATIONS IN SURFACE WAVE DEVICES AND PRESSURE TRANSDUCER UTILIZING THIS PROCESS

[75] Inventor: Pierre Hartemann, Paris, France

[73] Assignee: Thomson-CSF, Paris, France

[21] Appl. No.: 149,244

[22] Filed: May 12, 1980

[30] Foreign Application Priority Data

May 16, 1979 [FR] France .................................. 79 12458

[51] Int. Cl.³ .................... G01N 27/00; H03B 3/04; H03H 9/42
[52] U.S. Cl. .................................. 331/65; 331/37; 331/41; 331/107 A; 331/176
[58] Field of Search ................ 331/65, 107 A, 37, 41, 331/176

[56] References Cited

U.S. PATENT DOCUMENTS

| | | | |
|---|---|---|---|
| 2,935,704 | 5/1960 | Gordon et al. | 331/176 X |
| 3,355,949 | 12/1967 | Elwood et al. | 331/65 X |
| 3,889,205 | 6/1975 | Mitchell | 331/176 X |
| 4,272,742 | 6/1981 | Lewis | 331/107 A X |

Primary Examiner—Stanley T. Krawczewicz
Attorney, Agent, or Firm—Cushman, Darby & Cushman

[57] ABSTRACT

An arrangement for temperature compensating transducers including two elastic surface wave oscillators whose frequencies are mixed to produce an output frequency that is a function of a parameter to be measured such as force, pressure or acceleration. A delay element such as a transmission line having a delay that is a function of temperature is inserted into the loop of at least one of the oscillators to balance oscillator frequency deviations resulting from temperature changes.

11 Claims, 2 Drawing Figures

PROCESS FOR COMPENSATING TEMPERATURE VARIATIONS IN SURFACE WAVE DEVICES AND PRESSURE TRANSDUCER UTILIZING THIS PROCESS

BACKGROUND OF THE INVENTION

The present invention relates to a process for compensating temperature variations in devices incorporating two elastic surface wave oscillators, whose oscillation frequencies are mixed in such a way as to supply the difference between these frequencies.

Elastic surface waves which can propagate in a piezoelectric substrate are used in numerous applications and in particular, in conjunction with interdigitated transducers, for producing delay lines or resonators looped by means of amplifiers in order to provide oscillators operating in a range of very high frequencies (typically 100 MHz). The propagation rate of these waves in the substrate is liable to vary with different physical parameters, such as acceleration and pressure, so that such oscillators are more particularly used in accelerometers and force and pressure transducers. So as to reduce the frequency of the output signal in such a way that it can be more easily used, the transducers generally incorporate two oscillators, whose output signals have very similar frequencies and for example vary in the opposite direction to the parameter to be measured. These signals are mixed so as to supply an output signal, whose frequency is equal to the difference between the two oscillation frequencies and is therefore very small (typically 100 kHz). It varies with the parameter to be measured with a sensitivity equal to the algebraic sum of that of each oscillator considered separately in a quasi-linear manner, at least in a predetermined range of values.

Besides the parameter to be measured, the oscillation frequencies vary in a sensitive manner with the temperature. A very reduced temperature variation can be obtained through using two oscillators and forming the difference between the oscillation frequencies, whose variations as a function of the temperature have the same signs and similar values. However, possible dissymetries of the device and technological imperfections often make it impossible to sufficiently reduce this variation, particularly when there are very large temperature variation ranges and it is not always possible to place the device in a thermostatically controlled enclosure. This leads to systematic errors in the measurement of the parameter to be measured and these errors can reach the same order of magnitude as the parameter itself.

BRIEF SUMMARY OF THE INVENTION

The object of the invention is to obviate this disadvantage by a process making it possible to balance out the temperature variations of the two associated oscillators. The invention utilizes the properties of certain means for transmitting very high frequency signals, such as coaxial cables and lines with localized constants and which also have in some cases very large temperature variations, whereby the delays introduced are sufficiently small to ensure that the oscillation frequencies are only slightly changed. Thus, the process of the invention consists of inserting into the loop of at least one of the oscillators a propagation line introducing a delay which varies with the temperature and whose length is selected in such a way that the variation of the delay compensates the initial reference between the variations of the two oscillators. The invention also relates to any device incorporating two elastic surface wave oscillators utilizing such a process and in particular force and pressure transducers as well as accelerometers.

BRIEF DESCRIPTION OF THE DRAWINGS

The invention is described in greater detail hereinafter relative to non-limitative embodiments and the attached drawings, wherein.

DETAILED DESCRIPTION OF THE PREFERRED EMBODIMENTS

Figure 1:
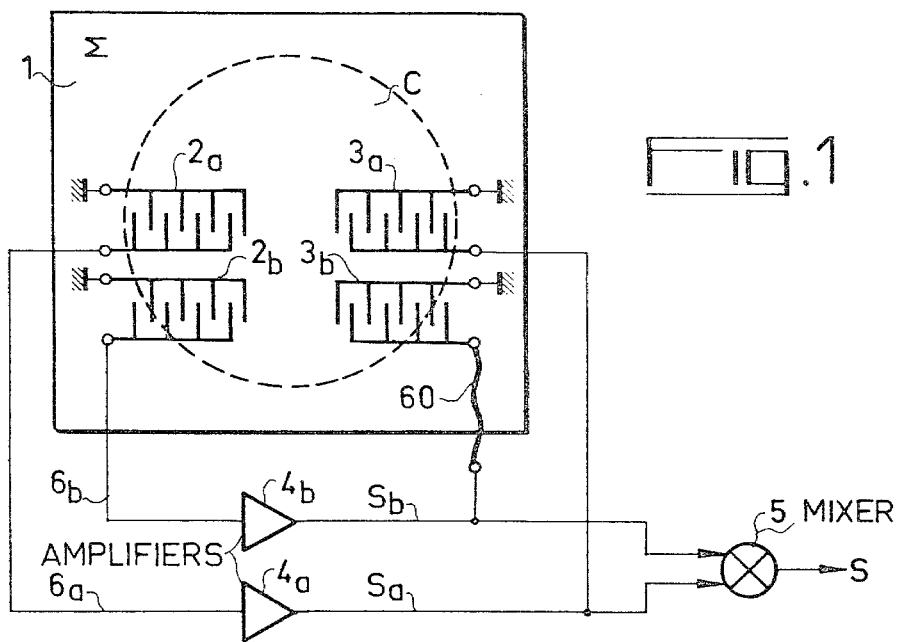
FIG. 1 is an elastic surface wave pressure transducer utilizing the process according to the invention.

FIG. 1 is a plan view of a pressure transducer formed with two delay lines carrying elastic surface waves and representing a nonlimitative exemplified application of the invention. The lines are provided on the surface $\Sigma$ of a piezoelectric substrate. Examples of piezoelectric materials which are conventionally used are quartz and lithium niobate, the latter having greater temperature variations than the former. The substrate is rectangular. It can be in the form of a thin rectangular board, whose edges are rigidly fixed to a support. This support has a circular central recess, whose path C on the board is shown by dotted lines in FIG. 1. The substrate can also comprise a thicker rigid block, whose centre is hollowed out so as to only leave a disk C of limited thickness. In both cases, the useful part of the substrate is disk C. The outer surface $\Sigma$ of the substrate is polished and, in the useful zone, are arranged pairs of transducers 2a-3a and 2b-3b, between which are respectively formed the two delay lines. The propagation axis of one of the lines coincides with a diameter of disk C. The axis of the other line is parallel to the aforementioned and is close to the periphery of the useful zone, in such a way that the effects of a pressure difference on the constraints placed on the corresponding zones of the board are of opposite signs and similar intensities.

The lines are looped on themselves, respectively by amplifier circuits 4a and 4b. This leads to oscillators a and b, whose respective output signals $S_a$ and $S_b$ have frequencies $F_a$ and $F_b$, which are close to one another but not equal, particularly due to the influence of the connections and the phase displacements introduced by the amplifiers into each loop. Moreover, these frequencies vary in opposite directions with the pressure. The signals $S_a$ and $S_b$ are mixed in a mixer 5, which supplies the outer signal S of frequency $F_a$-$F_b$. When the variations between the constraints exerted on the disk produce frequency variations the latter having opposite signs for example $\Delta F_a$ and $-\Delta F_b$, the frequency variation of signal S is equal to $\Delta F_a + \Delta F_b$. However, ambient temperature variations produce frequency variations of the same sign, i.e. $\delta F_a$ and $\delta F_b$, so that the frequency variation of sign S is equal to $\delta F_a - \delta F_b$. As the two lines have the same characteristics, i.e. the same material, lengths and adjacent operating frequencies, $\delta F_b$ is very close to $\delta F_a$. However, as neither the two lines nor the oscillation loops are strictly identical, the difference $\delta F_a - \delta F_b$ is not zero.

Without the compensation process according to the invention, the aforementioned transducer was produced with a quartz substrate, whose centre was cut out in Y-shaped manner so as to provide a useful area C of diameter 10 mm and thickness 250 μm. The oscillation frequency of each oscillator is approximately 100 MHz. The sensitivity obtained is 40 kHz/bar. A temperature variation of $$\frac{\delta(F_a - F_b)}{F_a - F_b}$$

of $10^{-7}/°C$. was measured. It is immediately apparent that when the temperature varies, e.g. between $-40°$ C. and $+100°$ C. the frequency of the output signal varies by 1.4 kHz, corresponding to a systematic error on the pressure of 35 mbar, which is not negligible with respect to the pressures which can be measured with this type of transducer.

The invention aims at eliminating this systematic error. The transducer shown in FIG. 1 utilizes the process according to the invention. A coaxial cable 60 is inserted into the loop of the oscillators, i.e. in this case b. This cable is at the same temperature as the lines, whose characteristics, namely the transmission speed of the signals of frequency $F_b$ and temperature variation are known and whose length l is determined in such a way as to bring the drift of oscillator b close to that of oscillator a. The method of determining length l is described hereinafter. Cable 60 is to be inserted in the loop of the oscillator having the greatest drift if its drift is of the same sign as that of the oscillators and, if this is not the case, into the loop of the oscillator having the smallest drift.

Figure 2:
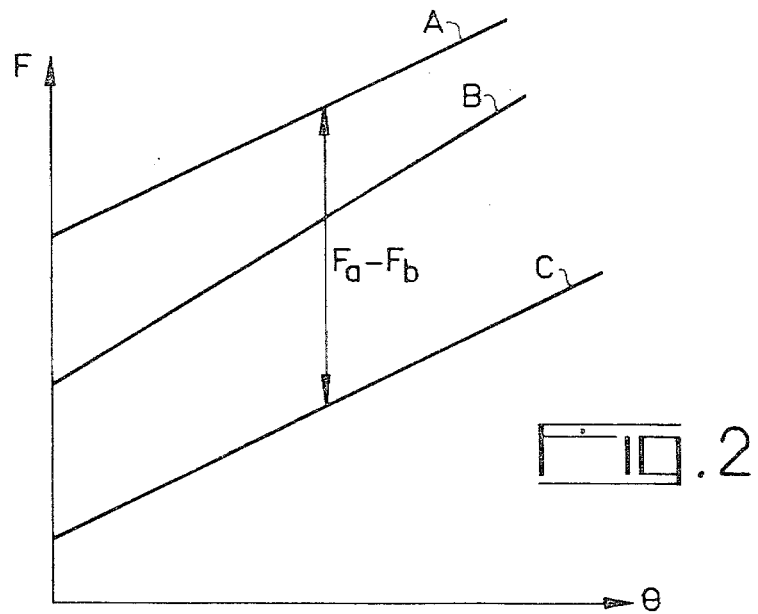
FIG. 2 is a diagram representing the response to temperature variations of the device of FIG. 1.

The diagram of FIG. 2 shows the variations of the oscillation frequencies at rest, i.e. for a zero pressure to be measured: $F_a$ and $F_b$, as a function of the temperature $\theta$, whereby the latter varies within a predetermined range. It has been assumed that these variations are linear, which is in accordance with the measurements performed on a device such as that described hereinbefore. Curve A is the variation curve of frequency $F_a$. Curve B is the variation curve of frequency $F_b$ in the absence of compensation (without cable 60). It is apparent that the oscillation frequency increases with temperature. However, in accordance with what has been stated hereinbefore, the slopes of the two curves are not equal, so that the variation between the two curves, corresponding to the difference $F_a - F_b$ at rest varies with the temperature. This difference decreases with the temperature, because the variation of $F_b$ is greater than that of $F_a$. Therefore, either an element introducing a delay should be introduced into the loop of oscillator (a) and whose effect is superimposed on that of the remainder of the loop, or an element introducing a delay should be introduced into the loop of oscillator (b) and whose first variation with temperature is in the opposite direction to that of the remainder of the loop, so that the variation curve of frequency $F_b$ has the same slope as the curve. It is the latter case which is illustrated here. It has been attempted to obtain curve C parallel to A. The following calculation shows how this compensation is possible. The oscillation condition of any oscillator is expressed by the equation $f \times T = n$ in which n is a number which can assume any whole value, f being the oscillation frequency of the "n" mode and T the sum of the delays introduced by the different elements of the loop, i.e. the line, amplifier and connections. The delay $T_o$ due to the line is greater, so that T is substantially equal to $T_o$. When one of the parameters to which the delays are sensitive varies and in particular $T_o$, a relative frequency variation is obtained which can be measured. For temperature variations $$\frac{\delta f}{f} = -\frac{\delta T}{T}.$$

For oscillator a:

$$\frac{\delta F_a}{F_a} = -\frac{\delta T_a}{T_a}.$$

For oscillator b with compensation, i.e. with an element introducing a supplementary delay $\tau$:

$$\frac{\delta F_b}{F_b} = -\frac{\delta T_b + \delta \tau}{T_b + \tau}.$$

The necessity for compensation results from the existence of a non-zero difference $$\frac{\delta T_a}{T_a} - \frac{\delta T_b}{T_b}$$

which has been measured. The object of the compensation is to obtain $$\frac{\delta T_b + \delta \tau}{T_b + \tau} = \frac{\delta T_a}{T_a}.$$

With the knowledge of $T_b$, $$\frac{\delta T_a}{T_a} - \frac{\delta T_b}{T_b}$$

and the drift $$\frac{\delta \tau}{\tau}$$

of the cable used it is possible to determine the delay $\tau$, thus the necessary cable length. By using the previous example in which $F_b \# 100$ MHz, i.e. $T_a \# T_b \# 1.5$ μs and $$\frac{\delta T_a}{T_a} - \frac{\delta T_b}{T_b} = -2.10^{-7}/°C.$$

and using a cable for which $$\frac{\delta \tau}{\tau} = 10^{-3}/°C.,$$

we obtain $$\frac{\delta \tau}{T_b + \tau} = \frac{\delta T_a}{T_a} - \frac{\delta T_b}{T_b}.$$

This gives $\tau \# 0.3$ ns. As the propagation rate in such a cable is approximately 5 ns/m, the necessary cable length is approximately 10 cm. The delay $\tau$ introduces a frequency shift $f_b$. On the basis of the equation $$\frac{\Delta F_b}{F_b} = \frac{\tau}{T_b} = -2.10^{-4};$$

$F_b$ consequently decreases by approximately 20 kHz and the difference $F_a$-$F_b$ increases by the same amount. If the increase in the output frequency signal is generally unimportant, because it is only a calibration problem for the transducer. However, if for other applications, it is desired that the difference $F_a$-$F_b$ retains its initial value, it is possible to insert into the loop of oscillator (a) an element introducing an adequate delay which is not sensitive to the temperature. It is possible to use for example a coaxial cable, whose dielectric is polytetrafluoroethylene and whose delay drift is approximately $-80 \times 10^{-6}/°C$. However, it is preferable to select for the compensating element a material which introduces a delay which is very sensitive with the temperature in order to obtain the shortest necessary length.

For performing the process according to the invention, it is necessary to:
- to form drift measurements in the absence of compensation on one of the devices on which it is to be used;
- select the element to be used for said compensation;
- approximately calculate the necessary length;
- introduce the element into the loop of the oscillator with the greatest drift;
- by successive measurements finely adjust the length of the element to obtain a zero variation in the selected temperature range.

The length obtained is generally suitable for all devices of this type manufactured in the same way. Among the materials which are liable to be suitable for this compensation, reference is made to certain coaxial cables with guided or unguided transmission or propagation, in which the nature of the dielectric mainly determines the variation. Thus, cables with a polyethylene dielectric have a variation of approximately $-250 \times 10^{-6}/°C$. Cables with a polyvinyl chloride dielectric have a much larger variation, i.e. $-880 \times 10^{-6}/°C$. This type of cable is therefore particularly advantageous.

FIG. 1 only shows an embodiment of the invention which can also be used with oscillators equipped with resonators. There is no need for the arrangement of the delay lines or resonators to be as shown in the drawing or for them to be arranged on the same substrate. The process according to the invention makes it possible to compensate temperature variations when the latter are approximately linear.

What is claimed is:

1. A process for the compensation of temperature variations in a device incorporating two elastic surface wave oscillators and mixer means supplying an output signal, whose frequency is equal to the difference of the oscillation frequency of the two oscillators, the latter having temperature variations of the same sign and unequal values, comprising inserting into the loop of at least a first one of the oscillators a transmission line which introduces a delay which varies with the temperature, whose length is selected in such a way that the variation of the delay with the temperature compensates an initial difference between the thermal variations of the two oscillators.

2. A process according to claim 1, wherein the transmission line is a coaxial cable.

3. A process according to claim 2, wherein the cable has a polyvinyl chloride dielectric.

4. A process according to claim 2, wherein the cable has a polyethylene dielectric.

5. A process according to claim 1, further including the step of inserting into the loop of a second oscillator a second transmission line introducing a delay having a smaller temperature variation than the transmission line inserted in the loop of the first oscillator in such a way as to maintain a predetermined initial value of the frequency of the output signal.

6. A pressure transducer of the type incorporating two delay lines looped onto themselves respectively by two amplifiers, said lines being arranged on the surface of a piezoelectric substrate in such a way as to have delays varying in the opposite direction to the pressure to be measured, whereby these lines cooperate with the amplifiers so as to form two oscillators, wherein the difference established between the thermal variations of the two oscillators is compensated by an electromagnetic transmission line inserted in an least one of the oscillator loops.

7. A transducer for supplying an output frequency signal indicative of a parameter to be measured, comprising:
   a piezoelectric substrate having a surface;
   first and second oscillators each formed by a delay line arranged on the surface of the substrate in circuit with an amplifier and a feedback path from an output end of a delay line, through its associated amplifier to an input end of the delay line, the delays of the two delay lines being established to vary in opposite directions with changes in the parameter to be measured;
   a mixer for mixing output signals from both oscillators and supplying the output frequency signal; and
   an electromagnetic transmission line inserted into the circuit of one of the oscillators, for introducing a delay as a function of temperature, the transmission line and the delay function being selected to compensate for any difference in temperature dependent response of the oscillators so as to render the output frequency signal independent of temperature, at least over predetermined ranges of temperature and the parameter to be measured.

8. A transducer according to claim 6 or 7 wherein the transmission line is a coaxial cable.

9. A transducer according to claim 8 wherein the coaxial cable includes a polyvinyl chloride dielectric.

10. A transducer according to claim 6 or 7 wherein transmission lines are inserted in both oscillator loops.

11. A transducer according to claim 10 wherein the delay associated with one of the transmission lines is greater than the delay of the other, the delays of each line being selected to achieve a predetermined frequency for each oscillator.

* * * * *